US012695064B2

(12) United States Patent
Hayasaka et al.

(10) Patent No.: US 12,695,064 B2
(45) Date of Patent: *Jul. 28, 2026

(54) PLASMA PROCESSING APPARATUS

(71) Applicant: Tokyo Electron Limited, Tokyo (JP)

(72) Inventors: Yusuke Hayasaka, Miyagi (JP); Shuhei Yamabe, Miyagi (JP); Naoki Tamaru, Miyagi (JP); Keisuke Yoshimura, Miyagi (JP); Kyo Tsuboi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 396 days.

This patent is subject to a terminal disclaimer.

(21) Appl. No.: 18/209,030

(22) Filed: Jun. 13, 2023

(65) Prior Publication Data

US 2023/0326724 A1     Oct. 12, 2023

Related U.S. Application Data

(63) Continuation of application No. 16/409,347, filed on May 10, 2019, now Pat. No. 11,715,630.

(30) Foreign Application Priority Data

May 11, 2018     (JP) ................................ 2018-092106

(51) Int. Cl.
*H01J 37/32*          (2006.01)
*H10P 72/00*         (2026.01)

(52) U.S. Cl.
CPC .. *H01J 37/32522* (2013.01); *H01J 37/32495* (2013.01); *H01J 37/32715* (2013.01);
(Continued)

(58) Field of Classification Search
USPC ...................................................... 156/345.37
See application file for complete search history.

(56) References Cited

U.S. PATENT DOCUMENTS 5,423,936 A      6/1995  Tomita et al.
5,616,208 A  *  4/1997  Lee ................... H01L 21/67017
                                                                                 134/1.1
(Continued)

FOREIGN PATENT DOCUMENTS

CN          1465094 A      12/2003
CN          1830072 A       9/2006
(Continued)

*Primary Examiner* — Ram N Kackar
(74) *Attorney, Agent, or Firm* — XSENSUS LLP

(57) ABSTRACT

A plasma processing apparatus is for performing plasma processing in a depressurizable inner space. The apparatus includes a chamber having therein an inner space, a supporting table provided in the inner space and configured to support a substrate to be mounted thereon, one or more first members included in the chamber or separate from the chamber and partially exposed to a depressurized environment including the inner space, and one or more second members included in the chamber or separate from the chamber, each being in contact with a corresponding one of said one or more first members, and partially disposed in an atmospheric pressure environment. The apparatus further includes one or more feeders each of which is configured to supply a coolant to a cavity formed in a corresponding one of said one or more second members.

19 Claims, 3 Drawing Sheets

(52) U.S. Cl.
CPC .. *H01J 37/32743* (2013.01); *H01J 37/32834* (2013.01); *H10P 72/0421* (2026.01); *H01J 2237/002* (2013.01); *H01J 2237/334* (2013.01)

(56) References Cited

U.S. PATENT DOCUMENTS

| | | | | |
|---|---|---|---|---|
| 5,997,649 | A * | 12/1999 | Hillman | ............ C23C 16/45574 |
| | | | | 438/758 |
| 6,302,964 | B1 * | 10/2001 | Umotoy | ............ C23C 16/45574 |
| | | | | 118/715 |
| 9,251,998 | B2 | 2/2016 | Hanaoka | |
| 2002/0185068 | A1 * | 12/2002 | Gurary | .............. H01L 21/67772 |
| | | | | 118/722 |
| 2004/0149214 | A1 * | 8/2004 | Hirose | .............. H01L 21/67126 |
| | | | | 118/715 |
| 2005/0003600 | A1 * | 1/2005 | Kasai | ................ C23C 16/45521 |
| | | | | 257/E21.585 |
| 2007/0022954 | A1 | 2/2007 | Iizuka et al. | |
| 2007/0131167 | A1 | 6/2007 | Kodashima et al. | |
| 2007/0158026 | A1 | 7/2007 | Amikura | |
| 2011/0168673 | A1 | 7/2011 | Nishimoto | |
| 2013/0162142 | A1 * | 6/2013 | Nishino | ............ H01J 37/32495 |
| | | | | 315/111.21 |
| 2015/0187542 | A1 | 7/2015 | Ishida | |
| 2015/0322571 | A1 * | 11/2015 | Yamasaki | ......... H01J 37/32522 |
| | | | | 118/723 R |
| 2016/0378092 | A1 * | 12/2016 | Yamamoto | ........... G05B 19/404 |
| | | | | 700/300 |

FOREIGN PATENT DOCUMENTS

| | | |
|---|---|---|
| JP | 1275784 A | 11/1989 |
| JP | 2007-142363 A | 6/2007 |
| JP | 5759718 B2 | 8/2015 |
| KR | 10-2008-0046284 A | 5/2008 |
| WO | 00/75972 A1 | 12/2000 |
| WO | 02/099861 A1 | 12/2002 |

* cited by examiner

PLASMA PROCESSING APPARATUS

CROSS-REFERENCE TO RELATED APPLICATION

This application is a continuation of U.S. application Ser. No. 16/409,347 filed on May 10, 2019, which claims priority to Japanese Patent Application No. 2018-092106, filed on May 11, 2018, the disclosures of which are incorporated herein in their entirety by reference, and priority is claimed to each for the foregoing.

TECHNICAL FIELD

The present disclosure relates to a plasma processing apparatus.

BACKGROUND

In manufacturing electronic devices, a plasma processing apparatus is used. The plasma processing apparatus generates plasma by exciting a gas supplied into a chamber. A substrate is processed by a chemical species from the generated plasma.

As for a plasma processing apparatus, a plasma processing apparatus described in Japanese Patent No. 5759718 is known. The plasma processing apparatus described in Japanese Patent No. 5759718 includes a chamber, a mounting table, an upper electrode, a first high frequency power source, and a second high frequency power source. The mounting table is provided in an inner space of the chamber. The mounting table supports a substrate to be mounted thereon. The mounting table serves as a lower electrode. The upper electrode is provided above the mounting table. The first high frequency power source supplies a high frequency power for plasma generation to the lower electrode. The second high frequency power source supplies a high frequency power for ion attraction (high frequency bias power) to the lower electrode.

The power level of the high frequency bias power may be increased in order to increase an etching rate of plasma etching to be performed by the plasma processing apparatus. In the case of using a high frequency power having a high power level, it is required to cool a member that may have a high temperature in a depressurized environment of the chamber.

SUMMARY

In accordance with an aspect of the present disclosure, there is provided a plasma processing apparatus for performing plasma processing in a depressurizable inner space. The plasma processing apparatus includes a chamber, a supporting table, one or more first members, and one or more feeders. The chamber has therein an inner space. The supporting table is provided in the inner space and configured to support a substrate to be mounted thereon. The one or more first members are included in the chamber or separate from the chamber and partially exposed to a depressurized environment including the inner space. The one or more second members are included in the chamber or separate from the chamber. Each of the second members is in contact with a corresponding one of the one or more first members, and partially disposed in an atmospheric pressure environment. Each of the one or more feeders is configured to supply a coolant to a cavity formed in a corresponding one of said one or more second members.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
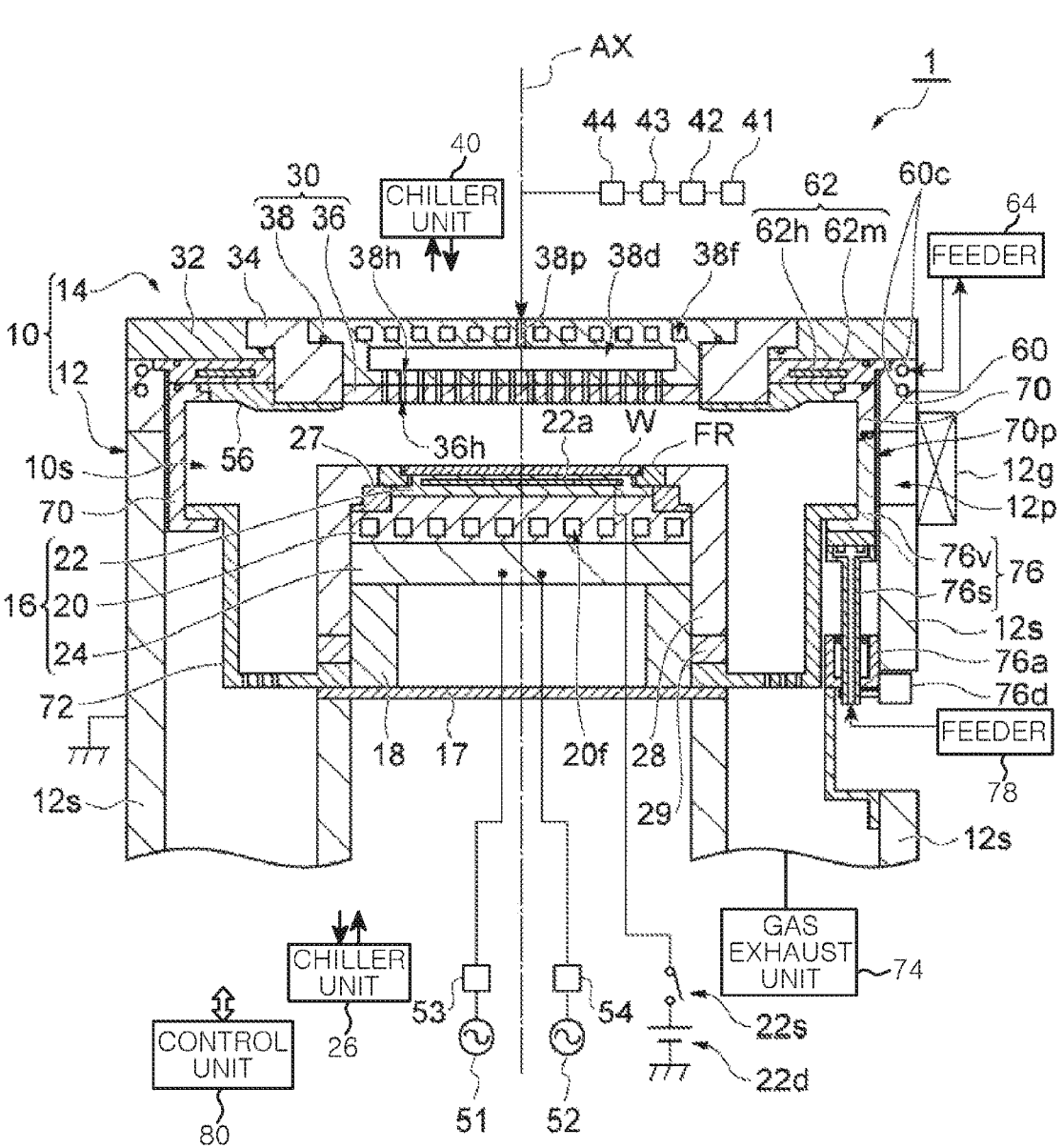
FIG. 1 schematically shows a plasma processing apparatus according to an embodiment.

Hereinafter, embodiments will be described in detail with reference to the accompanying drawings. Like reference numerals will be given to like or corresponding parts throughout the drawings.

Figure 2:
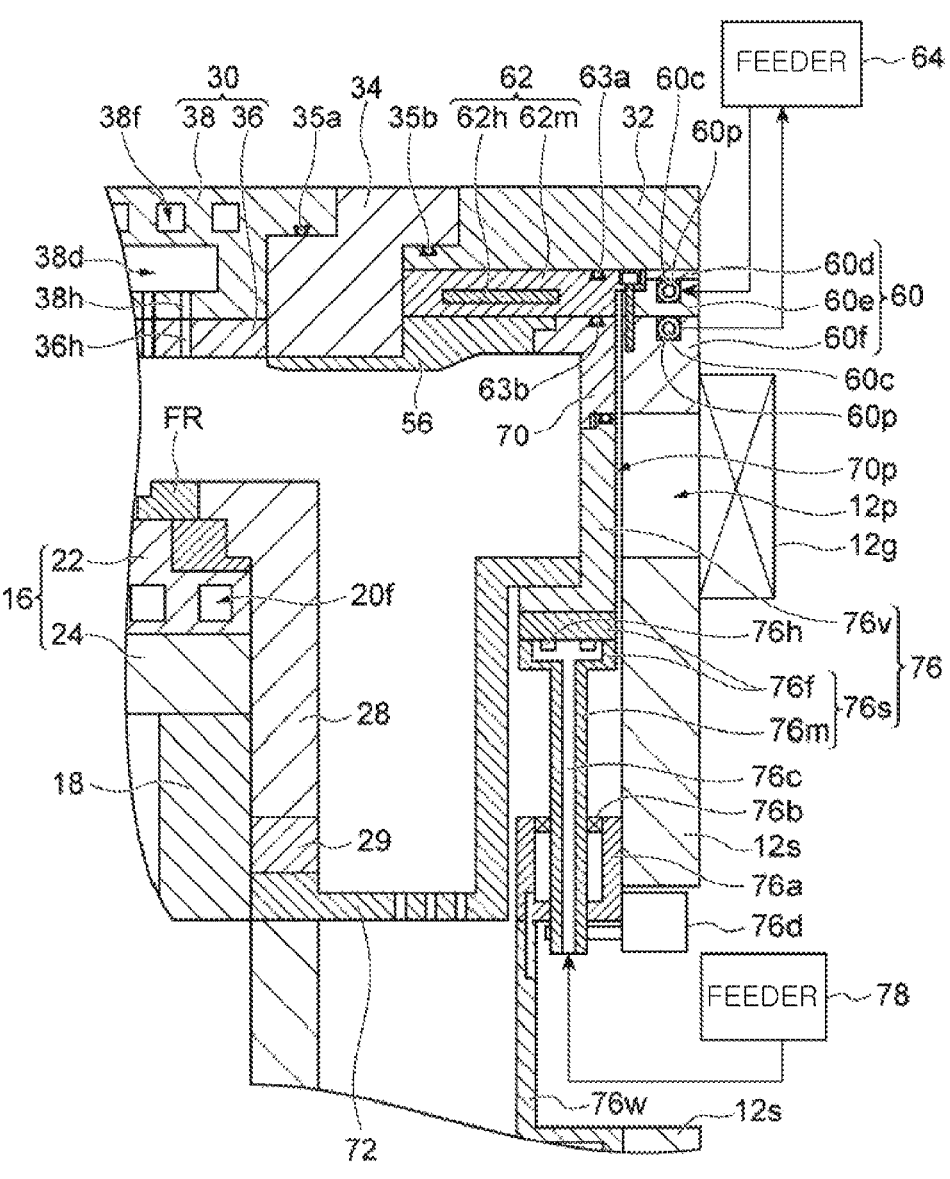
FIG. 2 is a partially enlarged cross-sectional view of the plasma processing apparatus shown in FIG. 1.
Figure 3:
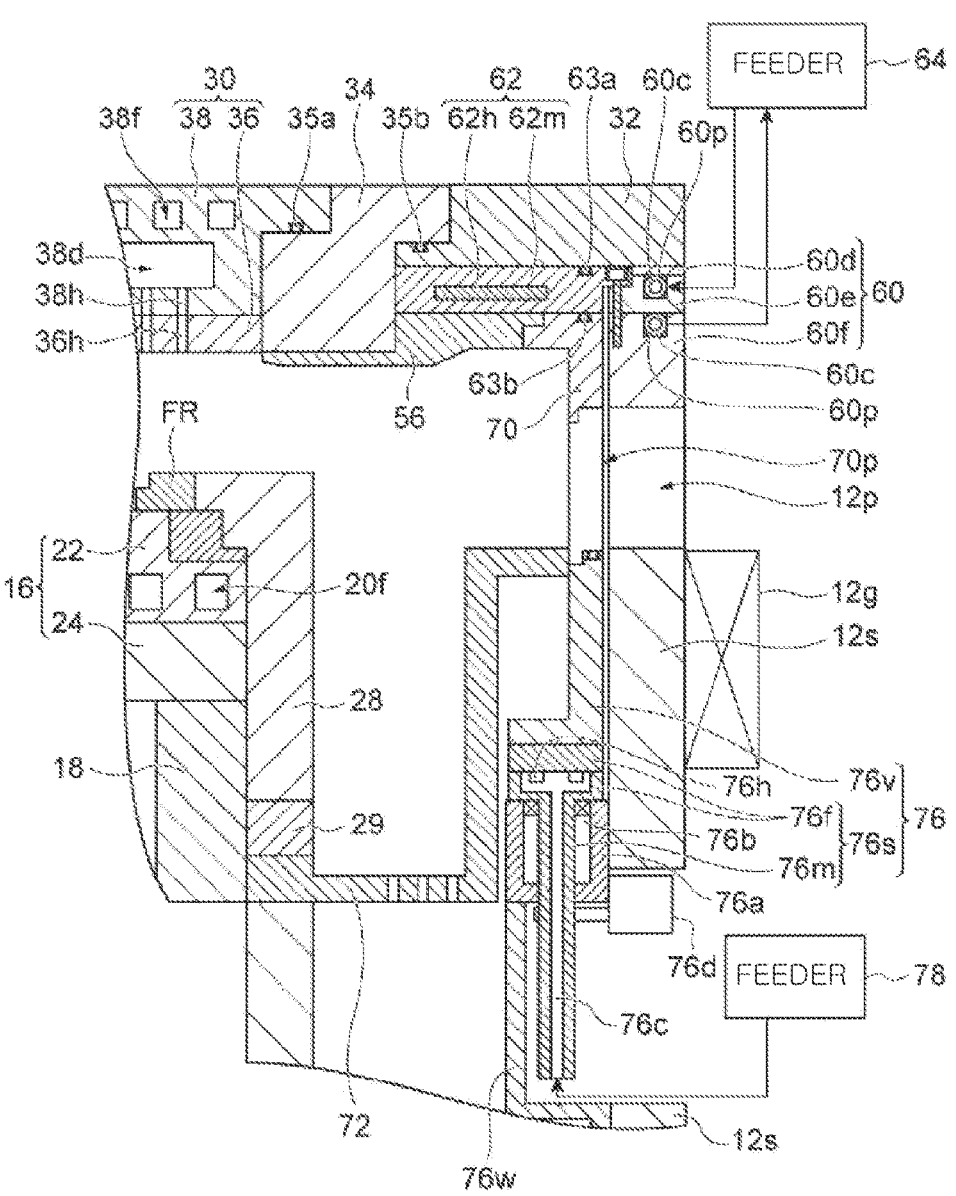
FIG. 3 is a partially enlarged cross-sectional view of the plasma processing apparatus shown in FIG. 1.

FIG. 1 schematically shows a plasma processing apparatus according to an embodiment. FIGS. 2 and 3 are partially enlarged cross-sectional views of the plasma processing apparatus shown in FIG. 1. FIG. 2 shows a state in which an opening is blocked by a valve body of an exemplary shutter mechanism. FIG. 3 shows a state in which the opening is opened by the valve body of the exemplary shutter mechanism. The plasma processing apparatus 1 shown in FIGS. 1 to 3 includes a chamber 10. The chamber 10 has therein an inner space 10s. The inner space 10s can be depressurized. The chamber 10 includes a chamber body 12 and a chamber body 14.

The chamber body 12 has a sidewall 12s. The sidewall 12s has a substantially cylindrical shape. The inner space 10s is disposed in the sidewall 12s. The sidewall 12s extends in a vertical direction. A central axis of the sidewall 12s substantially coincides with an axis AX extending in the vertical direction. The chamber body 12 is electrically grounded. The chamber body 12 is made of, e.g., aluminum. A corrosion resistant film is formed on a surface of the chamber body 12. The corrosion resistant film is made of, e.g., aluminum oxide or yttrium oxide. The sidewall 12s has an opening 12p (first opening). The opening 12p can be opened and closed by a gate valve 12g. The substrate W is transferred between the inner space 10s and the outside of the chamber 10 through the opening 12p.

A supporting table 16 is provided in the inner space 10s. The supporting table 16 is configured to support the substrate W to be mounted thereon. A bottom plate 17 is provided below the supporting table 16. A supporting part 18 extends upward from the bottom plate 17. The supporting part 18 has a substantially cylindrical shape. The supporting part 18 is made of an insulator, e.g., quartz. The supporting table 16 is mounted on and supported by the supporting part 18.

The supporting table 16 includes a lower electrode 20 and an electrostatic chuck 22. The supporting table 16 may further include an electrode plate 24. The electrode plate 24 has a substantially disc shape. The central axis of the electrode plate 24 substantially coincides with the axis AX. The electrode plate 24 is made of a conductor, e.g., aluminum.

The lower electrode 20 is disposed on the electrode plate 24. The lower electrode 20 is electrically connected to the electrode plate 24. The lower electrode 20 has a substantially disc shape. The central axis of the lower electrode 20 substantially coincides with the axis AX. The lower electrode 20 is made of a conductor, e.g., aluminum. A flow path 20*f* is formed in the lower electrode 20. The flow path 20*f* extends in a spiral shape, for example. A coolant is supplied from a chiller unit 26 to the flow path 20*f*. The chiller unit 26 is provided outside the chamber 10. The chiller unit 26 supplies, e.g., a liquid coolant, to the flow path 20*f*. The coolant supplied to the flow path 20*f* is returned to the chiller unit 26.

The electrostatic chuck 22 is provided on the lower electrode 20. The electrostatic chuck 22 includes a main body and an electrode 22*a*. The main body of the electrostatic chuck 22 has a substantially disc shape. The central axis of the electrostatic chuck 22 substantially coincides with the axis AX. The main body of the electrostatic chuck 22 is made of ceramic. The electrode 22*a* is a film made of a conductor. The electrode 22*a* is disposed in the main body of the electrostatic chuck 22. A DC power supply 22*d* is connected to the electrode 22*a* through a switch 22*s*. When the substrate W is held on the electrostatic chuck 22, a voltage from the DC power supply 22*d* is applied to the electrode 22*a*. When the voltage is applied to the electrode 22*a*, an electrostatic attractive force is generated between the electrostatic chuck 22 and the substrate W. By generating the electrostatic attractive force, the substrate W is attracted to and held on the electrostatic chuck 22. The plasma processing apparatus 1 may include a gas line for supplying a heat transfer gas (e.g., helium gas) to a gap between the electrostatic chuck 22 and a backside of the substrate W.

A focus ring FR is provided on a peripheral portion of the electrostatic chuck 22 to surround the substrate W. The focus ring FR is used to improve the in-plane uniformity of the plasma processing on the substrate W. The focus ring FR is made of, e.g., silicon, quartz, or silicon carbide. A ring 27 is provided between the focus ring FR and the lower electrode 20. The ring 27 is made of an insulator.

The plasma processing apparatus 1 may further include a tubular portion 28 and a tubular portion 29. The tubular portion 28 extends along the outer peripheries of the supporting table 16 and the supporting part 18. The tubular portion 28 is provided on the tubular portion 29. The tubular portion 28 is made of a corrosion resistant insulator. The tubular portion 28 is made of, e.g., quartz. The tubular portion 29 extends along the outer periphery of the supporting part 18. The tubular portion 29 is made of a corrosion resistant insulator. The tubular portion 29 is made of, e.g., quartz.

The chamber body 14 is provided to block an upper end opening of the chamber 10. The chamber body 14 includes an upper electrode 30. The chamber body 14 may further include a member 32 and a member 34. The member 32 is a substantially annular plate and made of a metal, e.g., aluminum. The member 32 is disposed on the sidewall 12*s* through a spacer 60 to be described later. The member 34 is arranged between the upper electrode 30 and the member 32. The member 34 extends in a circumferential direction around the axis AX. The member 34 is made of an insulator, e.g., quartz. A sealing member 35*a* such as an O-ring is disposed between the upper electrode 30 and the member 34. A sealing member 35*b* such as an O-ring is disposed between the member 34 and the member 32.

The upper electrode 30 includes a ceiling plate 36 and a holder 38. The ceiling plate 36 has a substantially disc shape. The ceiling plate 36 is in contact with the inner space 10*s*. The ceiling plate 36 is provided with a plurality of gas injection holes 36*h*. The gas injection holes 36*h* penetrate through the ceiling plate 36 in a plate thickness direction (vertical direction). The ceiling plate 36 is made of silicon, aluminum oxide, or quartz. Alternatively, the ceiling plate 36 may be obtained by forming a corrosion resistant film on a surface of a conductor member such as an aluminum member. The corrosion resistant film is made of, e.g., aluminum oxide or yttrium oxide.

The holder 38 is provided at the ceiling plate 36. The holder 38 detachably supports the ceiling plate 36. The holder 38 is made of, e.g., aluminum. A flow path 38*f* is formed in the holder 38. In the holder 38, the flow path 38*f* extends in a spiral shape, for example. The coolant is supplied to the flow path 38*f* from a chiller unit 40 provided outside the chamber 10. The chiller unit 40 supplies a liquid coolant (e.g., cooling water) to the flow path 38*f*. The coolant supplied to the flow path 38*f* is returned to the chiller unit 40. The chiller unit 40 is configured to supply the coolant to the flow path 38*f* at a flow rate of, e.g., 4 L/min or more.

A gas diffusion space 38*d* is formed in the holder 38. A plurality of holes 38*h* is formed in the holder 38. The holes 38*h* extend downward from the gas diffusion space 38*d* and are connected to the gas injection holes 36*h*, respectively. The holder 38 is provided with a port 38*p*. The port 38*p* is connected to the gas diffusion space 38*d*. A gas source group 41 is connected to the port 38*p* through a valve group 42, a flow rate controller group 43, and a valve group 44.

The gas source group 41 includes a plurality of gas sources. Each of the valve group 42 and the valve group 44 includes a plurality of valves. The flow rate controller group 43 includes a plurality of flow rate controllers. Each of the flow rate controllers is a mass flow controller or a pressure control type flow controller. In the plasma processing apparatus 1, gases from one or more gas sources selected among the plurality of gas sources of the gas source group 41 are supplied to the gas diffusion space 38*d*. The gases supplied to the gas diffusion space 38*d* are supplied to the inner space 10*s* through the gas injection holes 36*h*.

The plasma processing apparatus 1 further includes a first high frequency power source 51 and a second high frequency power source 52. The first high frequency power source 51 generates a first high frequency power for plasma generation. The frequency of the first high frequency power is, e.g., 27 MHz or more. The first high frequency power source 51 is electrically connected to the lower electrode through a matching unit 53. The matching unit 53 has a matching circuit for matching an impedance of a first load side (the lower electrode 20 side) and an output impedance of the first high frequency power source 51. The first high frequency power source 51 may be connected to the upper electrode 30, instead of the lower electrode 20, through the matching unit 53.

The second high frequency power supply 52 generates a second high frequency power for ion attraction to the substrate W. The frequency of the second high frequency power is, e.g., 13.56 MHz or less. The second high frequency power source 52 is electrically connected to the lower electrode 20 through a matching unit 54. The matching unit 54 has a matching circuit for matching the impedance of the load side (the lower electrode 20 side) and an output impedance of the second high frequency power source 52.

The chamber body 14 further includes a member 56. The member 56 is a substantially annular plate. The member 56 is arranged at a diametrically outer region of the ceiling plate 36 to extend in a circumferential direction. The diametrical direction is a radial direction about the axis AX. A heater unit 62 is arranged between the member 56 and the member 32 and between the member 34 and the spacer 60. The heater unit 62 includes a main body 62m and a heater 62h. The main body 62m is a first member of one embodiment.

The main body 62m extends in the circumferential direction to surround the upper electrode 30. The main body 62m is a substantially annular plate. The main body 62m is made of a conductor, e.g., aluminum. The heater 62h heats the main body 62m. The heater 62h is disposed in the main body 62m. The heater 62h may be a resistance heating element.

Sealing members such as O-rings are provided between the main body 62m and neighboring members thereof to separate the depressurized environment including the inner space 10s and the atmospheric pressure environment. Specifically, a sealing member 63a is provided between the main body 62m and the member 32. A sealing member 63b is provided between the main body 62m and an upper end of a shield 70 to be described later. The main body 62m is partially exposed to the depressurized environment. On the surface of the main body 62m, a region disposed at an inner side of the sealing member 63a and the sealing member 63b communicate with the inner space 10s. The region on the surface of the main body 62m is exposed to the depressurized environment.

The spacer 60 is a second member of one embodiment. The spacer 60 is disposed at a diametrically outer region of the main body 62m of the heater unit 62. The spacer 60 extends in the circumferential direction to surround the main body 62m of the heater unit 62. The spacer 60 is disposed at a diametrically outer region of the sealing member 63a and the sealing member 63b. Therefore, the spacer 60 is disposed under the atmospheric pressure environment. The spacer 60 is made of, e.g., aluminum.

The spacer 60 is in contact with the main body 62m of the heater unit 62. Specifically, an outer edge region of the main body 62m and an inner edge region of the spacer 60 are overlapped in the vertical direction. The outer edge region of the main body 62m and the inner edge region of the spacer 60 are in contact with each other. The main body 62m and the spacer 60 are fixed to each other using, e.g., screws, in a state where the outer edge region of the main body 62m and the inner edge region of the spacer 60 are in contact with each other.

The spacer 60 has therein a cavity 60c. The cavity 60c extends in the circumferential direction in the spacer 60. A coolant is supplied to the cavity 60c from a feeder 64. The feeder 64 is provided outside the chamber 10. The coolant may be a liquid coolant, e.g., cooling water or brine. The coolant supplied to the cavity 60c is returned to the feeder 64. By supplying the coolant to the spacer 60, the main body 62m of the heater unit 62 is indirectly cooled. In other words, it is possible to cool the main body 62m without directly supplying the coolant to the main body 62m of the heater unit 62.

In one embodiment, the plasma processing apparatus 1 includes a pipe 60p. The pipe 60p is made of, e.g., stainless steel. The pipe 60p has therein the cavity 60c. By using the pipe 60p, corrosion of the spacer 60 is suppressed. The pipe 60p is disposed in a groove formed in the spacer 60.

In one embodiment, the spacer 60 includes spacer components 60d to 60f. The spacer components 60d to 60f are made of, e.g., aluminum. Each of the spacer components 60d to 60f is a substantially annular plate or has a substantially cylindrical shape. The spacer components 60d to 60f are stacked in the vertical direction. The groove having therein the pipe 60p is defined by the surface of the spacer component 60e and the surface of the spacer component 60f. The number of the spacer components of the spacer 60 is not limited to three.

The plasma processing apparatus 1 may further include the shield 70. The shield 70 is provided to prevent by-products generated by the plasma process from being adhered to an inner wall surface of the chamber 10. The shield 70 has a substantially cylindrical shape. The shield 70 is disposed along an inner wall surface of the sidewall 12s between the sidewall 12s and the supporting table 16. The shield 70 extends downward from the main body 62m of the heater unit 62. The shield 70 is made of a conductor, e.g., aluminum. A corrosion resistant film is formed on the surface of the shield 70. The corrosion resistant film is made of, e.g., aluminum oxide or yttrium oxide.

A baffle member 72 is provided between the shield 70 and the supporting part 18. The outer edge of the baffle member 72 is coupled to the lower end of the shield 70. The inner edge of the baffle member 72 is embedded between the tubular portion 29 and the bottom plate 17. The baffle member 72 is a conductor plate made of, e.g., aluminum. A corrosion resistant film is formed on the surface of the baffle member 72. The corrosion-resistant film is made of, e.g., aluminum oxide or yttrium oxide. A plurality of through-holes is formed in the baffle member 72.

The inner space 10s includes a gas exhaust region extending downwards from the baffle member 72. A gas exhaust unit 74 is connected to the gas exhaust region. The exhaust unit 74 includes a pressure regulator such as an automatic pressure control valve and a vacuum pump such as a turbo molecular pump.

An opening 70p (second opening) is formed at the shield 70. The opening 70p is formed at the shield 70 to face the opening 12p. The substrate W is transferred between the inner space 10s and the outside of the chamber through the opening 12p and the opening 70p.

The plasma processing apparatus 1 may further include a shutter mechanism 76. The shutter mechanism 76 is configured to open and close the opening 70p. The shutter mechanism 76 includes a valve body 76v and a shaft body 76s. The shutter mechanism 76 may further include a cylindrical body 76a, a sealing portion 76b, a wall portion 76w, and a driving unit 76d.

The valve body 76v closes the opening 70p in a state where the valve body 76v is disposed in the opening 70p. The valve body 76v is a first member of one embodiment. The valve body 76v is supported by the shaft body 76s. In other words, the shaft body 76s is connected to the valve body 76v. The shaft body 76s extends downward from the valve body 76v. The shaft body 76s includes a main portion 76m and a flange 76f. The main portion 76m is formed in a substantially cylindrical shape. In other words, the shaft body 76s has therein a cavity 76c. The flange 76f is provided on an upper end of the main portion 76m. The valve body 76v is provided on the flange 76f. The cavity 76c of the shaft body 76s is also formed in the flange 76f. The shaft body 76s is a second member of one embodiment. A heater 76h is provided in the flange 76f. The heater 76h is, e.g., a resistance heating element. The heater 76h is configured to heat the valve body 76v through the flange 76f.

The cylindrical body 76a has a cylindrical shape. The cylindrical body 76a is directly or indirectly fixed to the chamber main body 12. The main portion 76m of the shaft body 76s is vertically movable through the cylindrical body 76a. The driving unit 76d generates power for vertically moving the main portion 76m of the shaft body 76s. The driving unit 76d includes, e.g., a motor.

The sealing portion 76*b* is provided in the cylindrical body 76*a*. The sealing portion 76*b* blocks the gap between the cylindrical body 76*a* and the main portion 76*m* of the shaft body 76*s* to ensure airtightness of the inner space 10*s*. The sealing portion 76*b* separates the depressurized environment including the inner space 10*s* and the atmospheric pressure environment. The sealing portion 76*b* may be an O-ring or magnetic fluid seal, but is not limited thereto. The wall portion 76*w* extends between the cylindrical body 76*a* and the chamber body 12. The wall portion 76*w* blocks the gap between the cylindrical body 76*a* and the chamber body 12 to ensure airtightness of the inner space 10.

The plasma processing apparatus 1 may further include a feeder 78. The feeder 78 is configured to supply the coolant to the cavity 76*c*. The coolant is, e.g., air, cooling air, or an inert gas. By supplying the coolant to the shaft body 76*s* of the shutter mechanism 76, the valve body 76*v* is indirectly cooled. Therefore, it is possible to indirectly cool the valve body 76*v* without directly supplying the coolant to the valve body 76*v*.

In one embodiment, the plasma processing apparatus 1 may further include a control unit 80. The control unit 80 is configured to control the respective components of the plasma processing apparatus 1. The control unit 80 is, e.g., a computer device. The control unit 80 includes a processor, a storage device, an input device such as a keyboard, a display device, and a signal input/output interface. In the storage unit, a control program and recipe data are stored. The processor executes the control program and transmits a control signal to the respective components of the plasma processing apparatus 1 through the input/output interface based on the recipe data.

As described above, in the plasma processing apparatus 1, the first member that may have a high temperature by plasma processing performed in the depressurized environment can be indirectly cooled by supplying the coolant to the second member disposed in the atmospheric pressure environment. In other words, it is possible to cool the first member without directly supplying the coolant to the first member.

While various embodiments have been described above, various modifications can be made without being limited to the above-described embodiments. For example, the plasma processing apparatus 1 includes, as a configuration for cooling the first member through the second member, two configurations, i.e., a configuration including the main body 62*m* of the heater unit 62 and the spacer 60 and a configuration including the valve body 76*v* of the shutter mechanism 76 and shaft body 76*s*. However, the number of configurations for cooling the first member through the second member may be one or more. In other words, the plasma processing apparatus of the present disclosure may include one or more first members, one or more second members, and one or more feeders.

The configuration for cooling the first member through the second member is not limited to the configuration including the main body 62*m* of the heater unit 62 and the spacer 60 and the configuration including the valve body 76*v* and the shaft body 76*s* of the shutter mechanism 76. The configuration of cooling the first member through the second member may be applied to any part of the plasma processing apparatus 1. For example, the configuration for cooling the first member through the second member may be applied to the wall of the chamber 10, or the like. In other words, the first member and the second member may be included in the chamber 10. Alternatively, the first member and the second member may be separate from the chamber 10.

Further, the configuration for cooling the first member through the second member may be applied to any plasma processing apparatus other than the capacitively coupled plasma processing apparatus. The configuration for cooling the first member through the second member may be applied to, e.g., an inductively coupled plasma processing apparatus or a plasma processing apparatus that generates plasma using surface waves such as microwaves.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. A plasma processing apparatus comprising:
   a plasma processing chamber having a depressurizable inner space;
   a substrate support disposed in the plasma processing chamber;
   a lower electrode disposed in the substrate support;
   an upper electrode disposed above the substrate support;
   a first thermally conductive member surrounding the upper electrode, the first thermally conductive member being insulated from the upper electrode and the first thermally conductive member being partially exposed to a depressurized environment including the inner space;
   a heater disposed in the first thermally conductive member;
   a second thermally conductive member surrounding and contacting the first thermally conductive member, the second thermally conductive member having a coolant channel and the second thermally conductive member being disposed in an atmospheric pressure environment;
   a sealing member disposed between the first thermally conductive member and the second thermally conductive member, the sealing member separating the depressurized environment from the atmospheric pressure environment; and
   a coolant supply configured to supply a coolant to the coolant channel.

2. The plasma processing apparatus of claim 1, wherein the coolant is water.

3. The plasma processing apparatus of claim 1, further comprising a pipe disposed in the second thermally conductive member,
   wherein the pipe has the coolant channel.

4. The plasma processing apparatus of claim 3, wherein the pipe is disposed in a groove formed in the second thermally conductive member.

5. The plasma processing apparatus of claim 1, wherein the coolant is air.

6. The plasma processing apparatus of claim 1, wherein the first thermally conductive member is formed of aluminum material.

7. The plasma processing apparatus of claim 6, wherein the heater includes a resistive heating element.

8. The plasma processing apparatus of claim 7, wherein the second thermally conductive member is formed of aluminum material.

9. The plasma processing apparatus of claim 1, wherein the second thermally conductive member is exposed to an atmospheric environment.

10. The plasma processing apparatus of claim 1, wherein the second thermally conductive member is vertically overlapped with the first thermally conductive member.

11. The plasma processing apparatus of claim 1, wherein the second thermally conductive member has a cavity as the coolant channel.

12. The plasma processing apparatus of claim 1, further comprising a feeder configured to supply the coolant from the coolant supply to the coolant channel, wherein the feeder extends through the second thermally conductive member from the atmospheric pressure environment to the coolant channel, and wherein the coolant in the coolant channel indirectly cools the first thermally conductive member via thermal conduction through a contact surface between the first thermally conductive member and the second thermally conductive member.

13. A substrate processing apparatus comprising:

a chamber having a sidewall, the sidewall having a first opening;

a substrate support disposed in the chamber;

a tubular shield disposed between the sidewall of the chamber and the substrate support, the tubular shield having a second opening facing the first opening;

a shutter mechanism configured to open and close the second opening, the shutter mechanism including:

a valve body configured to close the second opening;

a shaft body connected to the valve body, the shaft body having a main portion and a flange, the flange contacting the valve body, the main portion extending downward from the flange, the shaft body having a cavity as a coolant channel;

a cylindrical body through which the main portion of the shaft body is movable; and a sealing portion provided in the cylindrical body, the sealing portion separating a depressurized environment including an inner space of the chamber from an atmospheric pressure environment;

a coolant supply configured to supply a coolant to the coolant channel;

wherein the shutter mechanism includes a heater disposed in the flange.

14. The substrate processing apparatus of claim 13, wherein the coolant is water.

15. The substrate processing apparatus of claim 13, wherein the coolant is air.

16. The substrate processing apparatus of claim 13, wherein the tubular shield includes a conductive body and a coating formed on the conductive body.

17. The substrate processing apparatus of claim 16, wherein the coating is formed of aluminum oxide or yttrium oxide.

18. The substrate processing apparatus of claim 13, wherein the heater includes a resistive heating element.

19. The substrate processing apparatus of claim 13, wherein the coolant supply is configured to supply the coolant to the cavity of the shaft body from the atmospheric pressure environment through a passage extending through the cylindrical body, and wherein the heater disposed in the flange is configured to heat the valve body while the coolant in the cavity cools the shaft body.

\* \* \* \* \*